United States Patent [19]

Shirasu

[11] Patent Number: 5,686,997
[45] Date of Patent: Nov. 11, 1997

[54] SCANNING PROJECTION EXPOSURE METHOD AND PROJECTION EXPOSURE APPARATUS

[75] Inventor: Hiroshi Shirasu, Kanagawa-ken, Japan

[73] Assignee: Nikon Corporation, Tokyo, Japan

[21] Appl. No.: 720,179

[22] Filed: Sep. 25, 1996

[30] Foreign Application Priority Data

Oct. 11, 1995 [JP] Japan .................................. 7-289254

[51] Int. Cl.$^6$ .............................. G01B 11/00; G01B 9/02
[52] U.S. Cl. ........................... 356/401; 356/363; 355/53; 250/548
[58] Field of Search ................................... 356/363, 400, 356/401; 250/548; 355/53

[56] References Cited

U.S. PATENT DOCUMENTS 5,602,620  2/1997  Miyazaki et al. ..................... 356/401

*Primary Examiner*—Frank G. Font
*Assistant Examiner*—Robert Kim
*Attorney, Agent, or Firm*—Armstrong, Westerman, Hattori, McLeland & Naughton

[57] ABSTRACT

After a mask (12) and a substrate (16) have been scanned as one unit relative to exposure light (32) to expose a predetermined area on the substrate (16), the mask (12) is stepped in a direction parallel but opposite to the scanning direction. Thereafter, the mask (12) and the substrate (16) are scanned as one unit again to expose another area on the substrate (16). Thus, throughput is improved when a large-sized substrate is divisionally exposed.

11 Claims, 7 Drawing Sheets

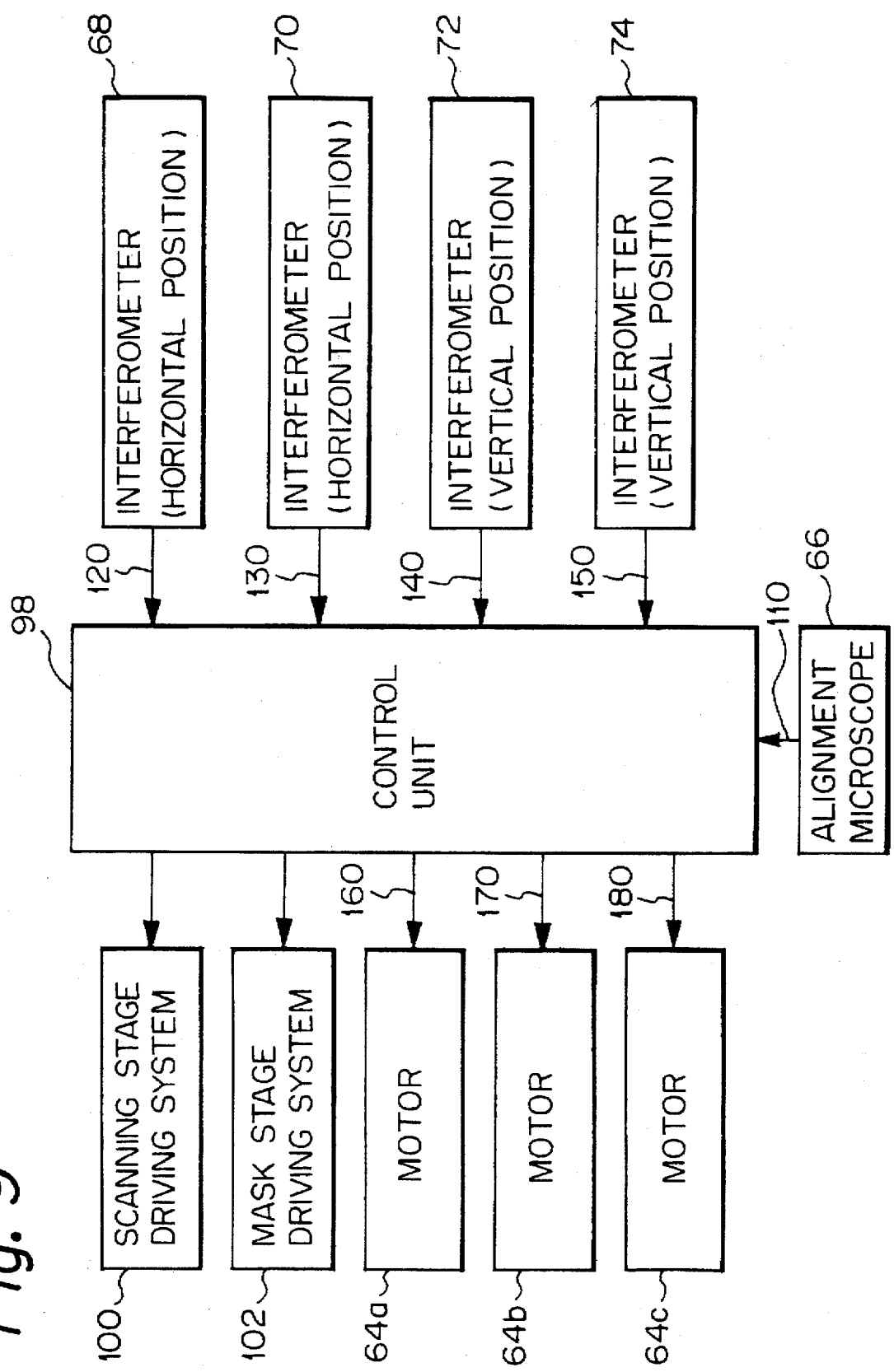

SCANNING PROJECTION EXPOSURE METHOD AND PROJECTION EXPOSURE APPARATUS

BACKGROUND OF THE INVENTION

1. Field of the Invention

The present invention relates to scanning exposure techniques, particularly to a technique whereby a mask formed with a predetermined pattern and a photosensitive substrate are scanned as one unit relative to exposure light to transfer the pattern onto the substrate. More particularly, the present invention relates to a scanning projection exposure method and apparatus wherein a mask pattern is sequentially transferred onto a plurality of areas on a substrate by exposure operation.

2. Related Background Art

Recently, in the above mechnical field, exposure for a large-sized substrate has been carried out by dividing the exposure area on the substrate with a view to preventing a projection optical system used for the exposure from increasing in size. More specifically, an area on a substrate is aligned with respect to a mask, and a scanning stage holding both the substrate and the mask as one unit is driven, thereby scanning the substrate and the mask as one unit relative to exposure light applied from above the mask. Next, the scanning stage is moved in directions X and Y to align a subsequent exposure area on the substrate with respect to the mask. Then, exposure for that area is carried out. By repeating these operations, exposure is carried out for all areas on the substrate. Techniques of this type include an invention disclosed, for example, in Japanese Patent Examined Publication No. 6-30335.

The above-described conventional technique suffers, however, from some problems as stated below. Because the mask and the substrate are stepped relative to each other in a two-dimensional XY-plane, alignment of the substrate with respect to the mask must be precisely effected for each exposure area on the substrate. That is, an alignment operation must inevitably be executed for each stepping because the mask and the substrate move relative to each other not only in the direction X but also in the direction Y. Accordingly, there has been a limit in improvement of throughput in the exposure operation.

SUMMARY OF THE INVENTION

An object of the present invention is to provide a scanning projection exposure method and apparatus wherein scanning projection exposure is carried out by stepping a substrate and a mask relative to each other not in both directions X and Y but in only one direction, e.g. the direction X, thereby enabling alignment of the substrate and the mask to be continuously effected in the direction X and eliminating the need for a special alignment operation which would otherwise be necessary for each stepping, and thus allowing an improvement of throughput.

In the present invention, the direction of stepping to the initial position of a subsequent exposure area on a substrate, which is executed upon completion of exposure for a predetermined area on the substrate, is set to only one direction parallel to the scanning direction (e.g., a direction X). That is, after exposure has been carried out for a predetermined area on the substrate by scanning the mask and the substrate as one unit in the scanning direction (direction X) relative to exposure light, the mask is stepped in a direction parallel but opposite to the scanning direction (direction X). Thereafter, the mask and the substrate are scanned as one unit in the scanning direction (direction X) again to expose another area on the substrate.

More specifically, the mask and the substrate are scanned as one unit in a first direction (i.e. the scanning direction X) relative to exposure light, thereby transferring a pattern on the mask onto a predetermined area on the substrate. Then, the mask is stepped in a second direction, which is parallel but opposite to the first direction (i.e. the scanning direction X), through a distance approximately equal to an effective width of the mask in the scanning direction. Thereafter, the mask and the substrate are scanned as one unit in the first direction relative to the exposure light again, thereby transferring the mask pattern onto another area on the substrate.

Preferably, the above-described first and second directions are each an approximately horizontal direction, and the mask and the substrate are held such that their surfaces are perpendicular to the approximately horizontal direction. Further, the relative position of the mask and the substrate is detected by each using detection light having an optical axis parallel to the first and second directions.

As described above, according to the present invention, the mask is stepped in a direction parallel to the scanning direction. Therefore, the substrate and the mask basically move only in a direction parallel to the scanning direction, that is, only in the direction X in the XY-plane. Accordingly, it becomes possible to continuously monitor the relative position of the mask and the substrate in a plane parallel to the surfaces of the substrate and mask during the exposure operation (scanning) and during the stepping. Thus, the alignment time can be shortened.

BRIEF DESCRIPTION OF THE DRAWINGS

FIG. 9 is a block diagram showing the arrangement of a control system in the second embodiment.

DESCRIPTION OF PREFERRED EMBODIMENTS

Embodiments of the present invention will be described below with reference to the accompanying drawings.

The present invention is applicable to an exposure technique for producing, for example, liquid crystal display substrates used as display devices of personal computers, televisions, etc. In the following embodiments, the present invention is applied to a scanning projection exposure apparatus used to form transparent thin-film electrodes in a desired pattern on a photosensitive substrate (e.g. a glass substrate) by photolithography technique.

Figure 1:
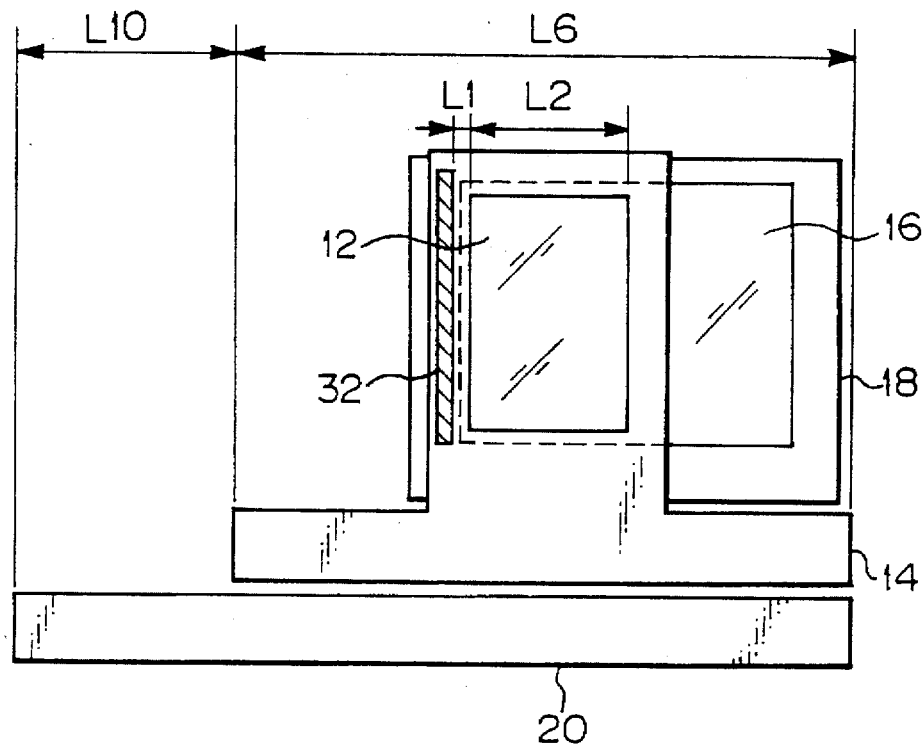
FIG. 1 is a conceptual (front) view showing the arrangement of an essential part of a scanning projection exposure apparatus according to a first embodiment of the present invention.
Figure 2:
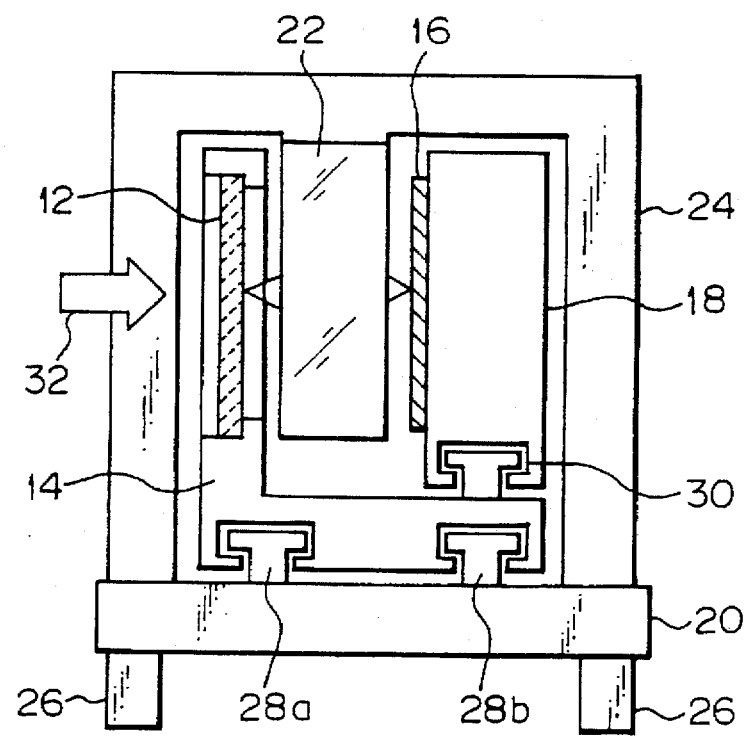
FIG. 2 is a side view of the apparatus according to the first embodiment, shown in FIG. 1.

FIGS. 1 and 2 are front and side views of a scanning projection exposure apparatus according to a first embodiment of the present invention. The apparatus according to this embodiment has a scanning stage 14 for holding a mask 12 formed with a predetermined circuit pattern. A substrate stage 18 holds a substrate 16 having a photoresist coated on a surface thereof. The substrate stage 18 is installed on a surface plate 20. A projection optical system 22 is disposed between the mask 12 and the substrate 16. A support frame 24 fixes the projection optical system 22 to the surface plate 20. The surface plate 20 is supported by vibration-isolating pads 26. Air guides 28a and 28b are provided between the surface plate 20 and the scanning stage 14 to slidably guide the scanning stage 14 in the horizontal direction as viewed in FIG. 1. An air guide 30 is provided between the scanning stage 14 and the substrate stage 18 to slidably guide the substrate stage 18 in the horizontal direction as viewed in FIG. 1. The mask 12 has an area (planar dimension) which is about a half of that of the substrate 16. The pattern on the mask 12 is transferred onto the substrate 16 twice for two halves of the substrate 16 by the projection optical system 22 with a magnification ratio of 1:1. It should be noted that illustration of the support frame 24 and the vibration-isolating pads 26 is omitted in FIG. 1.

Figure 3A:
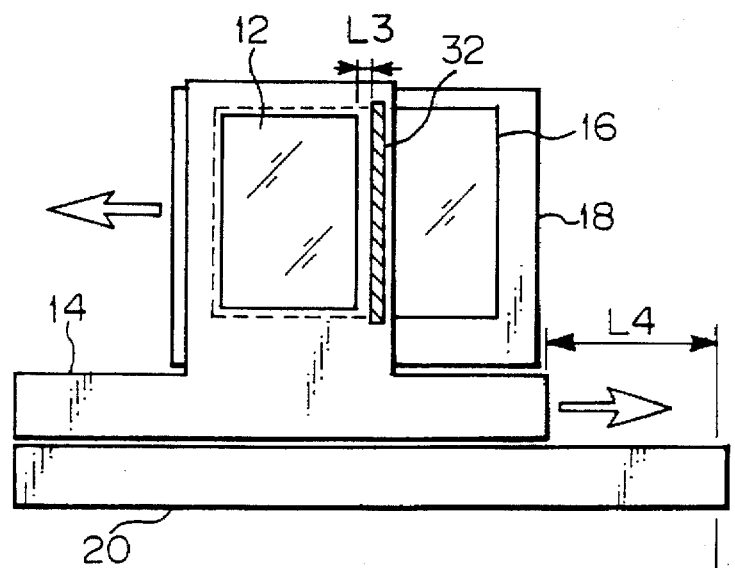
FIGS. 3A, 3B and 3C illustrate an operation of the first embodiment.

In the apparatus arranged as described above according to this embodiment, the scanning stage 14, which has the substrate stage 18 mounted thereon, is scanned leftward as viewed in FIG. 1 relative to slit-shaped exposure light 32 and stepped rightward, thereby transferring the pattern on the mask 12 onto the whole surface of the substrate 16 through the projection optical system 22. The operation of this embodiment will be explained below with reference to FIG. 3 in addition to FIGS. 1 and 2. First, to expose the left-hand half of the substrate 16, the mask 12 and the substrate 16 are aligned, as shown in FIG. 1, by an alignment mechanism (not shown). Next, the scanning stage 14, which has the substrate stage 18 mounted thereon, is moved leftward as viewed in FIG. 1 along the air guides 28a and 28b, thereby scanning the mask 12 and the substrate 16 relative to the exposure light 32. At this time, although the substrate stage 18 is movable independently of the scanning stage 14, it moves together with the scanning stage 14 as one unit because the substrate stage 18 is merely mounted on the scanning stage 14. More specifically, the two stages 14 and 18 are first moved through a distance L1 at an accelerated speed until the leading end of the mask 12 reaches the exposure light 32. Thereafter, the stages 14 and 18 are scanned at a constant speed through a distance L2 (scanning length), which is an effective exposure range. Then, as shown in FIG. 3A, the stages 14 and 18 are moved through a distance L3 at a decelerated speed before being stopped. That is, assuming that the width of the exposure light 32 is L3, the total travel distance L4 of the stages 14 and 18 is the sum of the acceleration distance L1, the deceleration distance L3, the exposure light width LB, and the scanning exposure length L2, i.e. L4=L1+L3+L8+L2.

Figure 3B:
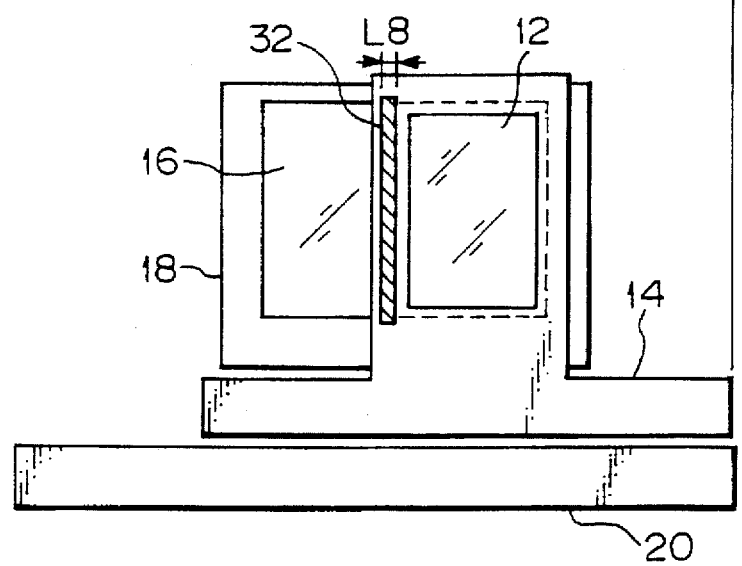
Figure 3C:
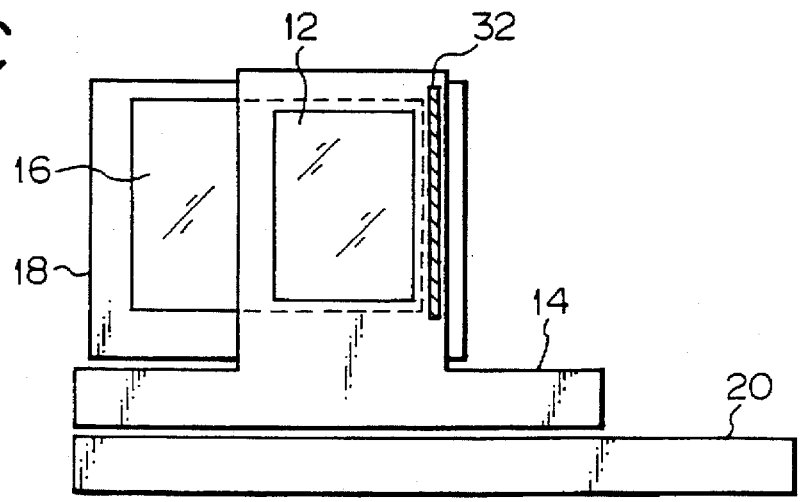

Next, to expose the right-hand half of the substrate 16, as shown in FIG. 3B, the scanning stage 14 is stepped back by the distance L4 in the rightward direction as viewed in the figure to return to the initial position. In the meantime, the substrate stage 18 is stepped leftward by the distance L2 relative to the scanning stage 14 along the air guide 30 to make the right-hand half of the substrate 16 face the mask 12. It should be noted that the order in which the stages 14 and 18 move through the respective distances L4 and L2 may be reverse to the above. Next, the scanning stage 14 is moved through the distance L1 at an accelerated speed together with the substrate stage 18 as one unit from the position shown in FIG. 3B in the same way as in the case of the exposure for the left-hand half of the substrate 16. Thereafter, the right-hand half of the substrate 16 is exposed by scanning the two stages 14 and 18 by the distance L2 at a constant speed. After movement through the distance L3 at a decelerated speed, the scanning stage 14, together with the substrate stage 18, stops as shown in FIG. 3C.

Figure 4:
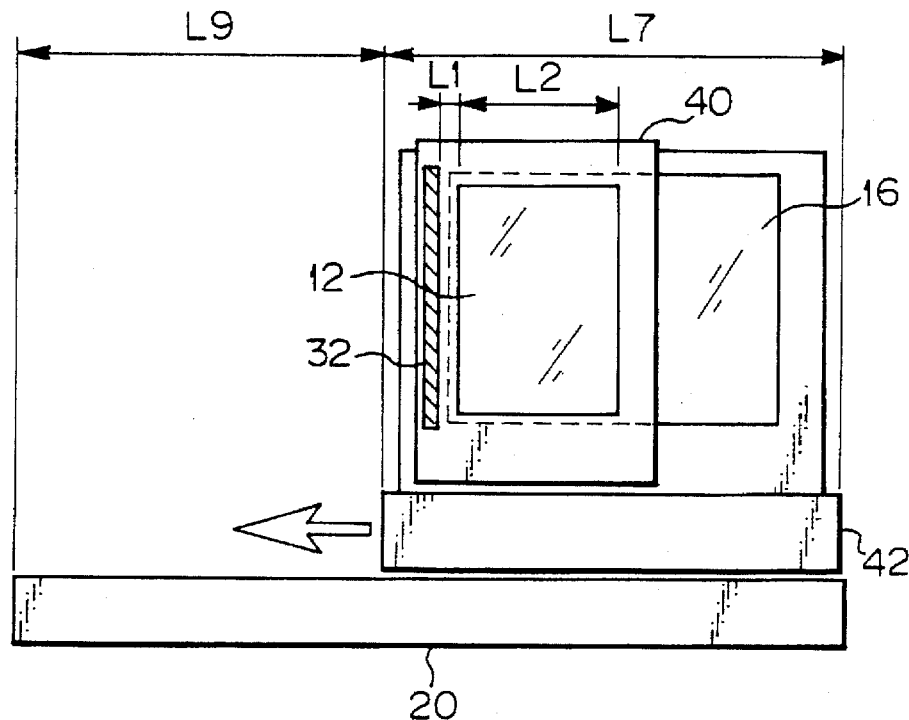
FIG. 4 is a conceptual (front) view showing the arrangement of an essential part of a scanning projection exposure apparatus according to a second embodiment of the present invention.
Figure 5:
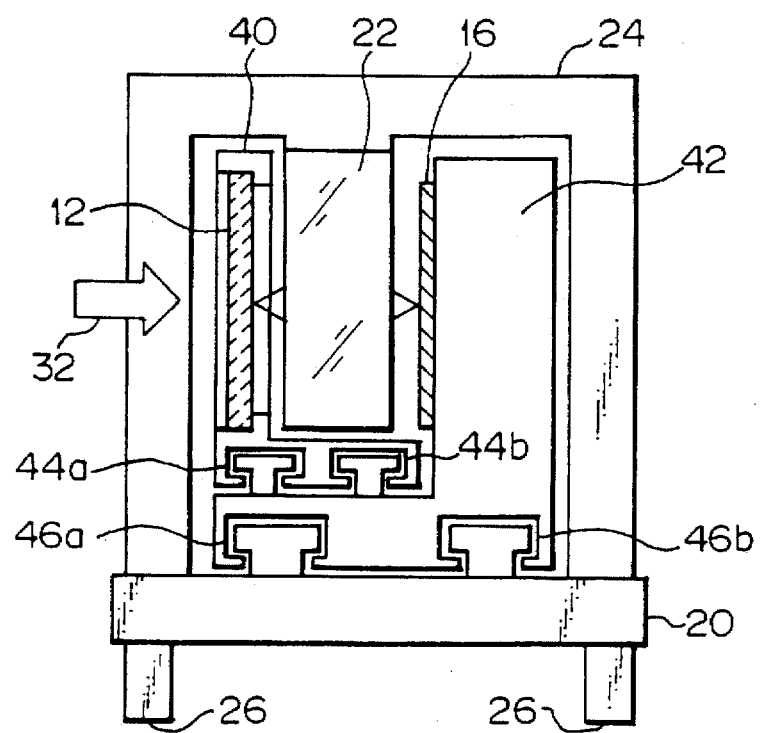
FIG. 5 is a side view of the apparatus according to the second embodiment, shown in FIG. 4.

FIGS. 4 and 5 are front and side views of a scanning projection exposure apparatus according to a second embodiment of the present invention. It should be noted that constituent elements which are identical or correspond to those of the first embodiment are denoted by the same reference numerals, and description thereof is omitted. The apparatus according to this embodiment is an improvement on the first embodiment. In the first embodiment, the scanning stage 14 holds the mask 12 as one unit, and the substrate 16 (substrate stage 18) is movable independently of the scanning stage 14, whereas, in this embodiment, a scanning stage 42 holds the substrate 16 as one unit, and a mask 12 (mask stage 40) is movable independently of the scanning stage 42. More specifically, the apparatus according to this embodiment has a mask stage 40 for holding a mask 12 formed with a predetermined circuit pattern, and a scanning stage 42 for holding a substrate 16 having a photoresist coated on a surface thereof. Air guides 44a and 44b are provided between the mask stage 40 and the scanning stage 42 to slidably guide the mask stage 40 over the scanning stage 42 in the horizontal direction as viewed in FIG. 4. Air guides 46a and 46b are provided between the surface plate 20 and the scanning stage 42 to slidably guide the scanning stage 42 over the surface plate 20 in the horizontal direction as viewed in FIG. 4. The mask 12 has an area (planar dimension) which is about a half of the area of the substrate 16. The pattern on the mask 12 is transferred onto the substrate 16 by the projection optical system 22 with a magnification ratio of 1:1.

Figure 6A:
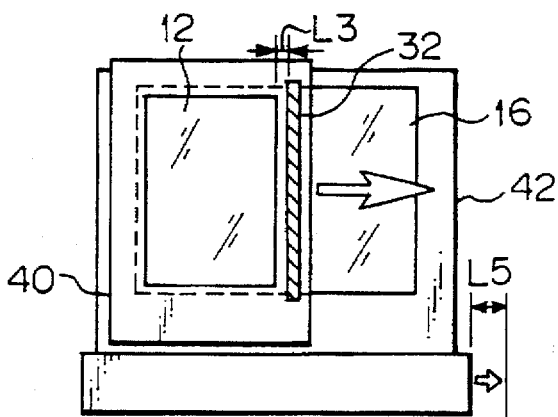
FIGS. 6A, 6B and 6C illustrate an operation of the second embodiment.

In the apparatus arranged as described above according to this embodiment, the scanning stage 42, which has the mask stage 40 mounted thereon, is scanned leftward as viewed in FIG. 4 relative to slit-shaped exposure light 32 and stepped rightward, thereby transferring the pattern on the mask 12 onto the whole surface of the substrate 16 through the projection optical system 22. The operation of this embodiment will be explained below with reference to FIG. 6 in addition to FIGS. 4 and 5. First, to expose the left-hand half of the substrate 16, the mask 12 and the substrate 16 are aligned as shown in FIG. 4 by an alignment microscope 66 (see FIG. 9; described later). Next, the scanning stage 42 is moved leftward as viewed in FIG. 4 along the air guides 46a and 46b, thereby moving the mask 12 and the substrate 16 as one unit and thus scanning them relative to the exposure light 32. More specifically, the scanning stage 42 is first moved through a distance L1 at an accelerated speed until the leading end of the mask 12 reaches the exposure light 32. Thereafter, the scanning stage 42 is moved (scanned) at a constant speed by a distance L2 (scanning length), which is an effective exposure range. Then, as shown in FIG. 6A, the scanning stage 42 is moved through a distance L3 at a decelerated speed before being stopped.

Next, to expose the right-hand half of the substrate 16, the scanning stage 42 is stepped back by a distance L5 (see FIG.

Figure 6B:
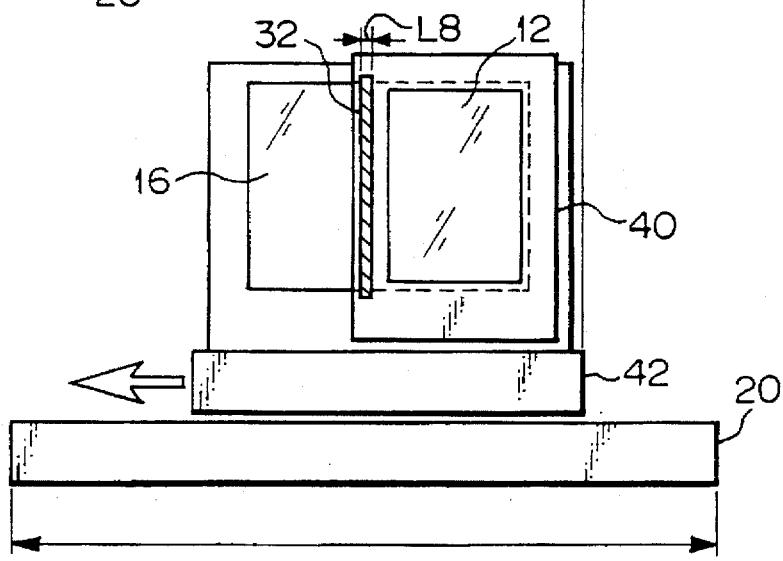
Figure 6C:
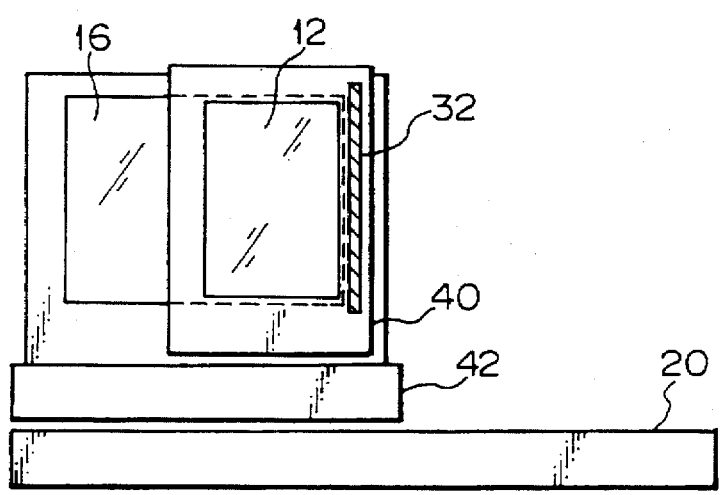

6A) in the rightward direction as viewed in the figure. It should be noted that the distance L5 is the sum of the acceleration distance L1, the deceleration distance L3, and the exposure light width LB, i.e. L5=L1+L3+L8. In the meantime, the mask stage 40 steps by a distance L2 rightwardly relative to the scanning stage 42 along the air guides 44a and 44b. In this case also, the order in which the stages 42 and 40 move through the respective distances L5 and L2 may be reverse to the above. Next, as shown in FIG. 6B, after returning to the acceleration start position, the scanning stage 42 is moved through the distance L1 at an accelerated speed and scanned through the distance L2 at a constant speed in the same way as in the case of the exposure for the left-hand half of the substrate 16, thereby exposing the right-hand half of the substrate 16. Then, the scanning stage 42 is moved through the distance L3 at a decelerated speed before being stopped as shown in FIG. 6C.

Let us compare the above-described first and second embodiments of the present invention. In the first embodiment, in which the substrate stage 18 holding the substrate 16 is stepped, as shown in FIG. 1, the scanning stage length L6 is approximately equal to the sum of the substrate stage length and the step length L2. In contrast, in the second embodiment, the scanning stage length L7 is approximately equal to the substrate stage length, as shown in FIG. 4. Further, the step back length L4 of the scanning stage 14 in the first embodiment is the sum of the acceleration distance L1, the deceleration distance L3, the exposure light width LB, and the scanning exposure length L2, i.e. L4=L1+L3+L8+L2, as described above. On the other hand, the step back length L5 of the scanning stage 42 in the second embodiment is relatively short; it is the sum of the acceleration distance L1, the deceleration distance L3, and the exposure light width LB, i.e. LS=L1+L3+L8, as described above. Thus, in the second embodiment, the step back length of the scanning stage 42, which is relatively heavy in weight, is short in comparison to the first embodiment. Accordingly, the exposure time can be shortened. As shown in FIGS. 1 and 4, the total scanning distance L9 of the scanning stage 42 in the second embodiment is longer than the total scanning distance L10 of the scanning stage 14 in the first embodiment. However, there is no large difference in the overall size of the apparatus between the first and second embodiments because the two embodiments are approximately equal in the length of the surface plate 20, i.e. (L6+L10)≈(L7+L9).

Figure 7:
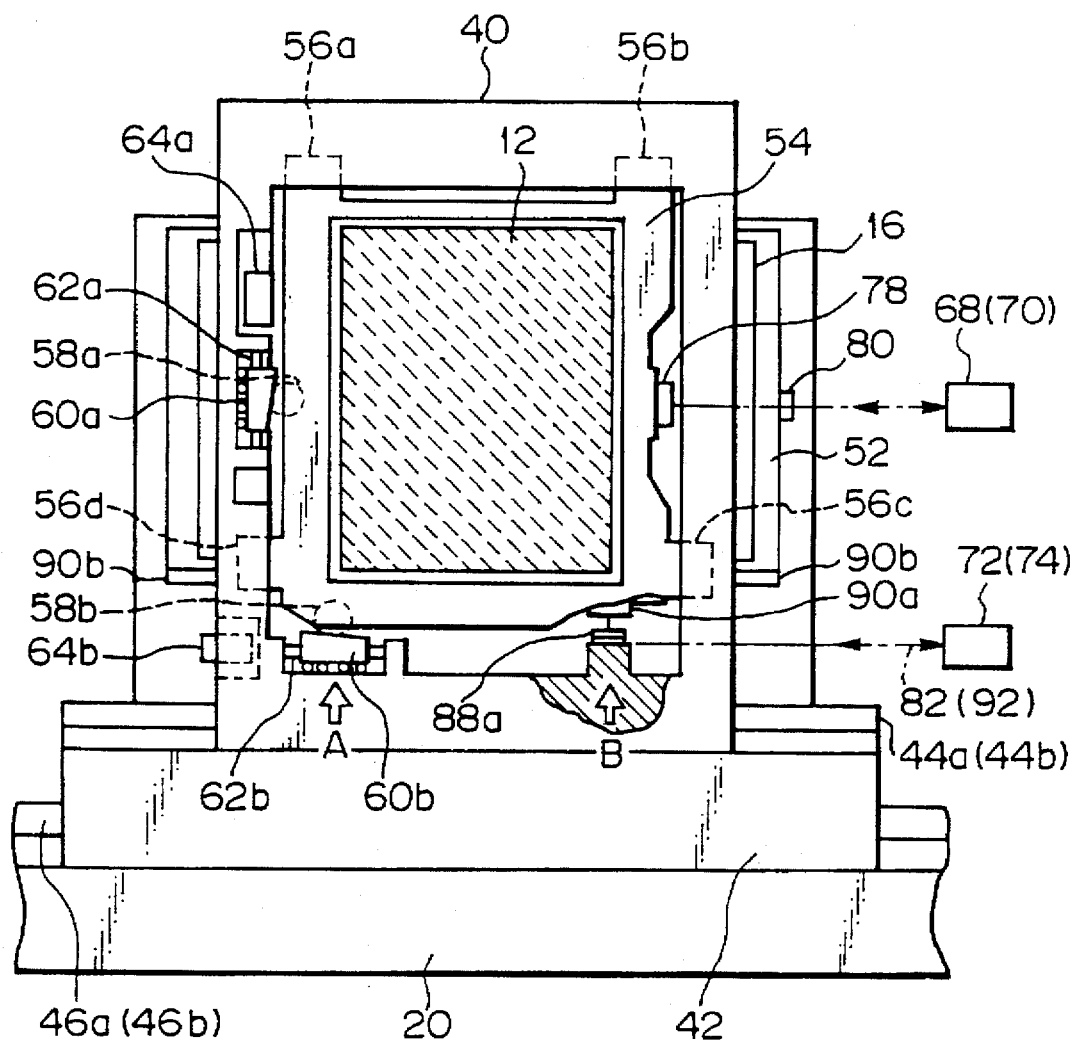
FIG. 7 is a partly-sectioned plan view showing in detail the arrangement of an essential part of the second embodiment, shown in FIG. 4.
Figure 8:
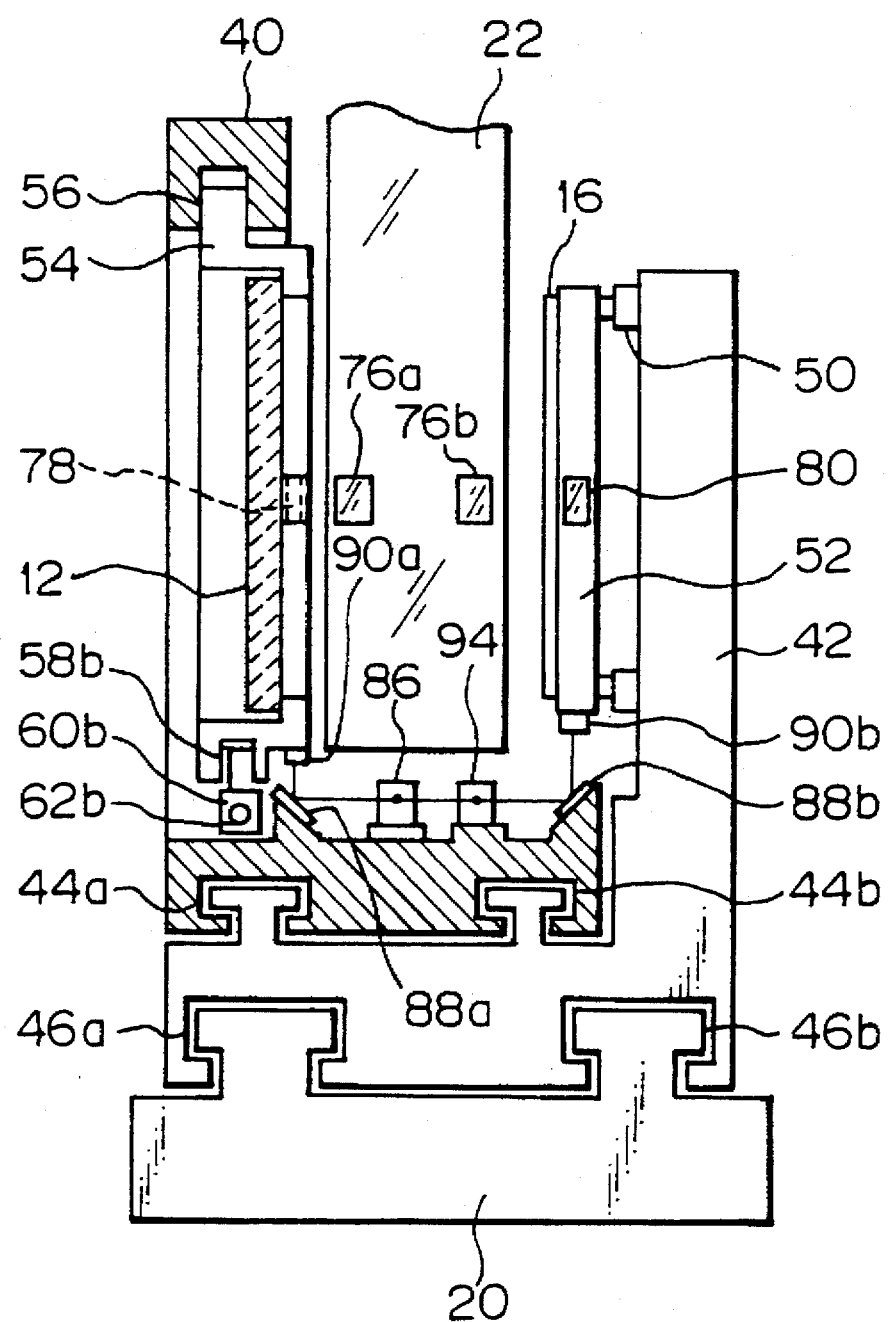
FIG. 8 is a partly-sectioned side view showing in detail the arrangement of an essential part of the second embodiment, shown in FIG. 5.

FIGS. 7 and 8 show in detail the arrangement of the apparatus according to the second embodiment of the present invention, shown in FIGS. 4 and 5. The substrate 16 is chucked by a substrate holder 52. The substrate holder 52 is supported by a driving mechanism 50. The gap between the mask 12 and the substrate 16 is measured with a detector (not shown). The gap and parallelism between the mask 12 and the substrate 16 are adjusted by the driving mechanism 50. On the other hand, the mask 12 is chucked by a mask holder 54. The mask holder 54 is supported by air guides 56a, 56b, 56c and 56d such that the mask holder 54 is restrained from moving in a direction perpendicular to the mask surface but movable in a direction parallel to the mask surface.

A driving mechanism for the mask holder 54 includes bearings 58a and 58b rotatably mounted on the mask holder 54, cams 60a and 60b having respective slant surfaces contacting the bearings 58a and 58b, and motors 64a and 64b for driving the cams 60a and 60b through screws 62a and 62b. Among these constituent elements, the bearing 58a, the cam 60a, the screw 62a and the motor 64a constitute in combination a driving mechanism used to adjust the position of the mask holder 54 in the horizontal direction. The bearing 58b, the cam 60b, the screw 62b and the motor 64b constitute in combination a driving mechanism used to adjust the mask holder 54 in the vertical direction. In a portion indicated by the arrow B in FIG. 7, a combination of a bearing, a cam, a screw and a motor 64c (see FIG. 9) is installed to adjust the position of the mask holder 54 in the vertical direction. This enables adjustment of the position in the direction of rotation. That is, the apparatus is provided with one driving mechanism for adjusting the horizontal position of the mask holder 54 and two driving mechanisms for adjusting the vertical position of the mask holder 54.

The relative position of the mask 12 and the substrate 16 is detected by simultaneously measuring the positions of alignment marks (not shown) respectively formed on the mask 12 and the substrate 16 with the alignment microscope 66 (see FIG. 9) through the projection optical system 22. A relative positional displacement between the mask 12 and the substrate 16 detected with the alignment microscope 66 is corrected by the above-described three mask holder driving mechanisms on the basis of the relative position of the mask holder 54 and the substrate holder 52 measured by an interferometer system (described later).

The interferometer system comprises interferometers of four axes. The relative position of the mask 12 and the substrate 16 in the horizontal direction is detected by interferometers 68 and 70. The interferometer 68 is provided between a fixed reflecting mirror 76a secured to the projection optical system 22 and a moving reflecting mirror 78 mounted on the mask holder 54. The interferometer 70 is provided between a fixed reflecting mirror 76b secured to the projection optical system 22 and a moving reflecting mirror 80 installed on the substrate holder 52. That is, the interferometers 68 and 70 detect a travel distance of the scanning stage 42 and the horizontal relative position of the mask holder 54 and the substrate holder 52.

The relative position of the mask 12 and the substrate 16 in the vertical direction is detected at two positions, that is, a portion indicated by the arrow A in FIG. 7 (on the other side of FIG. 8) and a portion indicated by the arrow B in FIG. 7 (on this side of FIG. 8). A laser beam 82 entering the portion A is branched to the left and right sides as viewed in FIG. 8 by a beam splitting member 86 provided on the mask stage 40. The two laser beams are reflected vertically by respective reflecting mirrors 88a and 88b and then incident on respective reflecting mirrors 90a and 90b. The reflecting mirror 90a is installed on the mask holder 54. The reflecting mirror 90b is a mirror of continuous length installed on the substrate holder 52. Laser beams reflected by the reflecting mirrors 90a and 90b travel backward along their respective incidence optical paths and enter the beam splitting member 86 where the two laser beams are combined to interfere with each other. The laser beams caused to interfere with each other enter an interferometer (detector) 72 installed on the surface plate 20. On the other hand, a laser beam 92 entering the portion B is branched to the left and right sides by a beam splitting member 94 provided on the mask stage 40. Thereafter, the two laser beams are reflected vertically by the reflecting mirrors 88a and 88b and incident on the reflecting mirrors 90a and 90b, respectively, as is the case with the portion A. Laser beams reflected by the reflecting mirrors 90a and 90b enter the beam splitting member 94 again where the two laser beams are combined to interfere with each other. The laser beams caused to interfere with each other enter an interferometer (detector) 74.

FIG. 9 schematically shows the arrangement of a control system of the apparatus according to this (second) embodiment. The control system has a control unit 98 as a central control unit that controls the operation of the entire apparatus. The control unit 98 controls a scanning stage driving system 100 and a mask stage driving system 102 for respectively driving the scanning stage 42 and the mask stage 40 in the horizontal direction (scanning direction) as viewed in FIG. 7. The control unit 98 calculates an amount of positional displacement between the mask 12 and the substrate 16 on the basis of a signal 110 from the alignment microscope 66. Further, the control unit 98 determines a relative position of the mask 12 and the substrate 16 on the basis of signals 120, 130, 140 and 150 from the interferometers 68, 70, 72 and 74. The control unit 98 calculates a correction quantity for the position of the mask 12 on the basis of the amount of positional displacement between the mask 12 and the substrate 16 and the relative position thereof determined as described above. Then, the control unit 98 supplies signals 160, 170 and 180 corresponding to the calculated correction quantity to the motors 64a, 64b and 64c. Thus, the position of the mask 12 in both the horizontal and vertical directions is adjusted by rotation of the motors 64a, 64b and 64c.

Thus, if the control unit 98 constantly monitors the relative position of the mask 12 and the substrate 16 through the interferometers 68, 70, 72 and 74, it is unnecessary to effect precise alignment once the mask 12 and the substrate 16 have been aligned before the commencement of exposure. That is, alignment of the mask 12 and the substrate 16 by the alignment microscope 66 is carried out for the first of two exposure processes, and it does not necessarily need to be executed for the second exposure process.

As has been described above, in this embodiment a laser beam for interference is applied in a direction parallel to the direction of scanning the mask 12 and the substrate 16 relative to the exposure light 32 (projection optical system 22). Therefore, the relative position of the mask 12 and the substrate 16 can be continuously detected. Accordingly, alignment of the mask 12 and the substrate 16 can be continuously effected with high accuracy during scanning exposure and after each stepping, which are effected by the scanning stage driving system 100 and the mask stage driving system 102 under control of the control unit 98. It should be noted that, although in the foregoing embodiment the beam splitting members 86 and 94 for interferometers are disposed on the mask stage 40, they may be disposed on the scanning stage 42. The number of times of exposure carried out for the substrate 16 may be three or more, although exposure is carried out twice in the foregoing embodiments. That is, the size ratio between the mask 12 and the substrate 16 may be other than 1:2, for example, 1:3.

It should be noted that the position detection and alignment system utilizing laser interferometry, shown in FIGS. 7 to 9, can also be applied to the first embodiment, shown in FIGS. 1 to 3.

Although the present invention has been described by way of embodiments, it should be noted that the present invention is not necessarily limited to the described embodiments, and that various changes and modifications may be imparted thereto without departing from the scope of the invention which is limited solely by the appended claims.

As has been described above, according to the present invention, the mask is stepped in a direction parallel to the scanning direction of the substrate and the mask. Therefore, there is basically no relative movement of the substrate and the mask in a direction perpendicular to the scanning direction. Accordingly, it becomes possible to continuously monitor the relative position of the mask and the substrate in a plane parallel to the surfaces of the substrate and mask during the exposure operation (scanning) and during the stepping. Thus, the alignment time can be shortened. As a result, the exposure operation improves in throughput.

What is claimed is:

1. An exposure method wherein a mask formed with a predetermined pattern and a photosensitive substrate are scanned as one unit relative to exposure light to transfer said pattern onto said substrate, said exposure method comprising:

the first step of scanning said mask and said substrate as one unit in a first direction relative to said exposure light, thereby transferring the pattern of said mask onto a predetermined area on said substrate;

the second step of stepping, after said first step, said mask relative to said substrate in a second direction parallel but opposite to said first direction by a distance approximately equal to a width of said mask in the scanning direction; and the third step of scanning, after said second step, said mask and said substrate as one unit in said first direction relative to said exposure light again, thereby transferring said pattern onto another area on said substrate.

2. A scanning exposure apparatus wherein a mask formed with a predetermined pattern and a photosensitive substrate are scanned as one unit relative to exposure light to transfer said pattern onto said substrate, said scanning exposure apparatus comprising:

a scanning stage for driving said substrate and said mask as one unit in a first direction;

a substrate stage for driving said substrate held by said scanning stage relative to said mask in a direction parallel to said first direction; and a control unit whereby, after the pattern of said mask has been transferred onto a predetermined area on said substrate by scanning said scanning stage in the first direction, said substrate stage is stepped in a second direction parallel but opposite to said first direction by a distance approximately equal to a width of said mask, and said scanning stage is driven to scan said mask and said substrate as one unit in said first direction relative to said exposure light again, thereby transferring said pattern onto another area on said substrate.

3. An apparatus according to claim 2, wherein said first and second directions are each an approximately horizontal direction, said mask and said substrate being held such that their surfaces are perpendicular to said approximately horizontal direction.

4. An apparatus according to claim 2, further comprising:

an interferometer for detecting a relative position of said mask and said substrate by each using detection light having an optical axis parallel to said first and second directions.

5. An apparatus according to claim 4, wherein said interferometer has an interference part for combining two detection lights, said interference part being provided on said scanning stage.

6. An apparatus according to claim 4, wherein said interferometer has an interference part for combining two detection lights, said interference part being provided on said substrate stage.

7. A scanning exposure apparatus wherein a mask formed with a predetermined pattern and a photosensitive substrate are scanned as one unit relative to exposure light to transfer said pattern onto said substrate, said scanning exposure apparatus comprising:

a scanning stage for driving said substrate and said mask as one unit in a first direction;

a mask stage for driving said mask held by said scanning stage relative to said substrate in a direction parallel to said first direction; and a control unit whereby, after the pattern of said mask has been transferred onto a predetermined area on said substrate by scanning said scanning stage in the first direction, said mask stage is stepped in a second direction parallel but opposite to said first direction by a distance approximately equal to a width of said mask, and said scanning stage is driven to scan said mask and said substrate as one unit in said first direction relative to said exposure light again, thereby transferring said pattern onto another area on said substrate.

8. An apparatus according to claim 7, wherein said first and second directions are each an approximately horizontal direction, said mask and said substrate being held such that their surfaces are perpendicular to said approximately horizontal direction.

9. An apparatus according to claim 7, further comprising:

an interferometer for detecting a relative position of said mask and said substrate by each using detection light having an optical axis parallel to said first and second directions.

10. An apparatus according to claim 9, wherein said interferometer has an interference part for combining two detection lights, said interference part being provided on said scanning stage.

11. An apparatus according to claim 9, wherein said interferometer has an interference part for combining two detection lights, said interference part being provided on said mask stage.

* * * * *